United States Patent [19]

Iranmanesh et al.

[11] Patent Number: 5,059,555

[45] Date of Patent: Oct. 22, 1991

[54] METHOD TO FABRICATE VERTICAL FUSE DEVICES AND SCHOTTKY DIODES USING THIN SACRIFICIAL LAYER

[75] Inventors: Ali A. Iranmanesh, Sunnyvale, Calif.; Lawrence K. C. Lam, Kent, Wash.

[73] Assignee: National Semiconductor Corporation, Santa Clara, Calif.

[21] Appl. No.: 570,068

[22] Filed: Aug. 20, 1990

[51] Int. Cl.[5] .................. H01L 21/90; H01L 21/44
[52] U.S. Cl. .................. 437/192; 437/189; 437/31; 437/33; 437/200; 437/201; 437/245; 357/71; 357/34
[58] Field of Search .......... 437/192, 200, 201, 193, 437/31, 33, 189, 245; 357/71, 34, 35

[56] References Cited

U.S. PATENT DOCUMENTS

| | | |
|---|---|---|
| 3,191,151 | 6/1965 | Price . |
| 3,648,125 | 3/1972 | Peltzer . |
| 4,624,046 | 11/1986 | Shideler et al. . |
| 4,649,409 | 3/1987 | Roppongi et al. . |
| 4,705,968 | 11/1987 | Taki . |
| 4,713,561 | 12/1987 | Yamada . |
| 4,754,172 | 6/1988 | Ovens et al. . |
| 4,764,480 | 8/1988 | Vora . |
| 4,795,722 | 1/1989 | Welch et al. .......... 437/192 |
| 4,800,176 | 1/1989 | Kakumu et al. .......... 437/193 |
| 4,808,548 | 2/1989 | Thomas et al. .......... 437/201 |
| 4,851,715 | 7/1989 | Strong . |
| 4,855,617 | 8/1989 | Ovens . |
| 4,870,033 | 9/1989 | Hotta et al. .......... 437/192 |
| 4,889,821 | 12/1989 | Selle et al. .......... 437/31 |
| 4,952,521 | 8/1990 | Goto .......... 437/33 |
| 4,960,732 | 10/1990 | Pixit et al. .......... 437/192 |
| 4,962,414 | 10/1990 | Liou et al. .......... 437/189 |
| 4,981,816 | 1/1991 | Kim et al. .......... 357/71 |

FOREIGN PATENT DOCUMENTS

| | | | |
|---|---|---|---|
| 0084465 | 7/1983 | European Pat. Off. . | |
| 3218474 | 12/1982 | Fed. Rep. of Germany | 437/200 |
| 2369652 | 5/1978 | France . | |
| 54-060582 | 5/1979 | Japan | 437/192 |
| 59-200418 | 11/1984 | Japan | 437/200 |
| 61-214427 | 9/1986 | Japan | 437/192 |
| 2-027727 | 1/1990 | Japan | 437/200 |

OTHER PUBLICATIONS

Grove, *Physics and Technology of Semiconductor Devices*, John Wiley & Sons, 1967, p. 113.
Brockhoff, "Electrically Shorted Semiconductor Junction Utilized as Programmable Read Only Memory Elements" (date unknown).
Peltzer et al., *Electronics* (Mar. 1, 1971), pp. 53–55.
Bursky, *Electronic Design* (Oct. 14, 1982), pp. 35–36.

*Primary Examiner*—Brian E. Hearn
*Assistant Examiner*—Kevin M. Picardat
*Attorney, Agent, or Firm*—Townsend and Townsend

[57] ABSTRACT

An improved method for fabricating polysilicon Schottky clamped transistors and vertical fuse devices in the same semiconductor structure is disclosed. The resulting structure yields an improved Schottky clamped transistor and vertical fuse device. The improved Schottky transistor has a silicide rectifying contact between the base and collector of the transistor, the vertical fuse is provided with a direct contact between an aluminum contact metal and a polysilicon emitter contact.

11 Claims, 6 Drawing Sheets

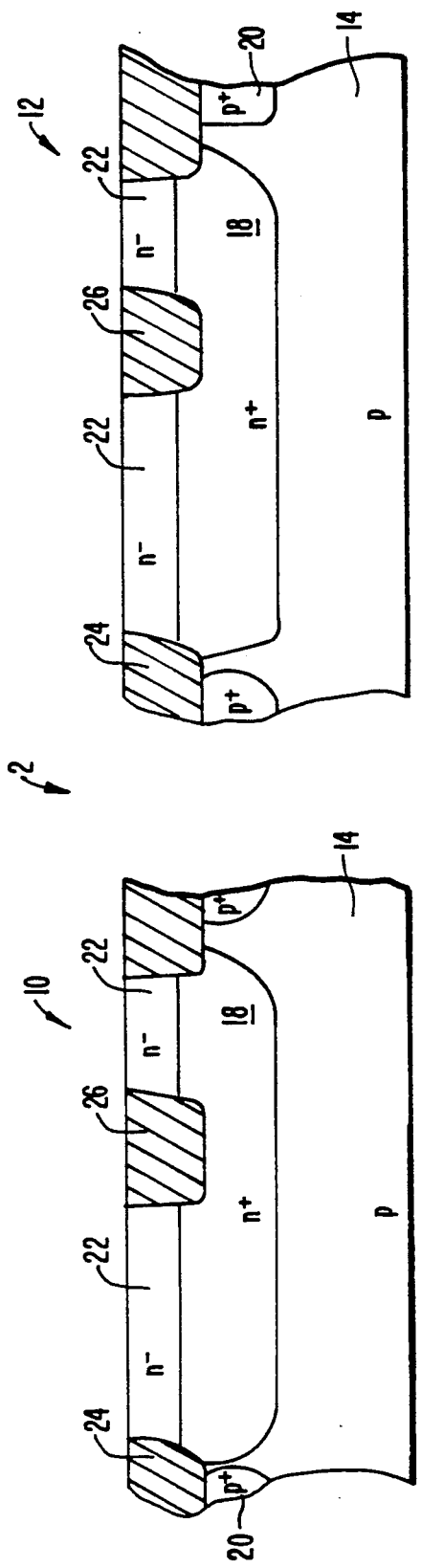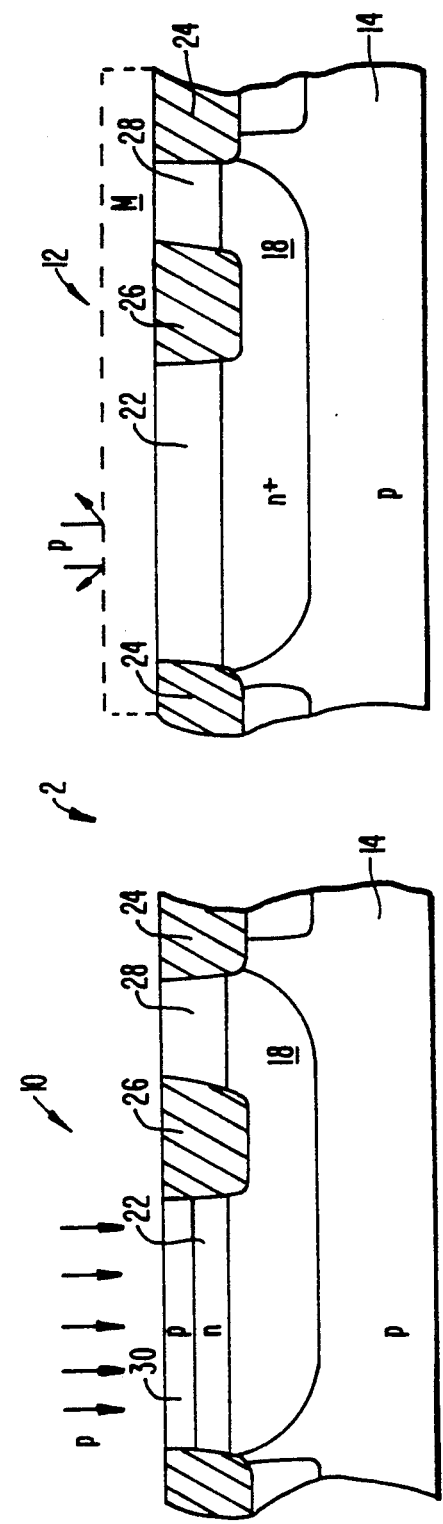
FIG. 2C.
FIG. 2D.

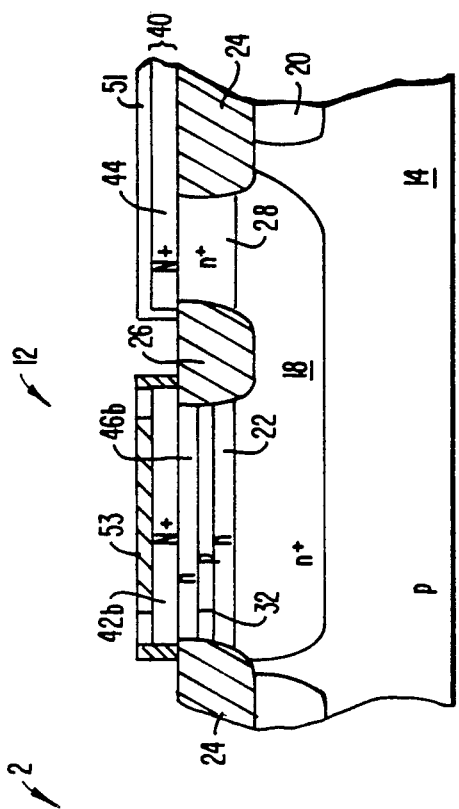
FIG. 2G.
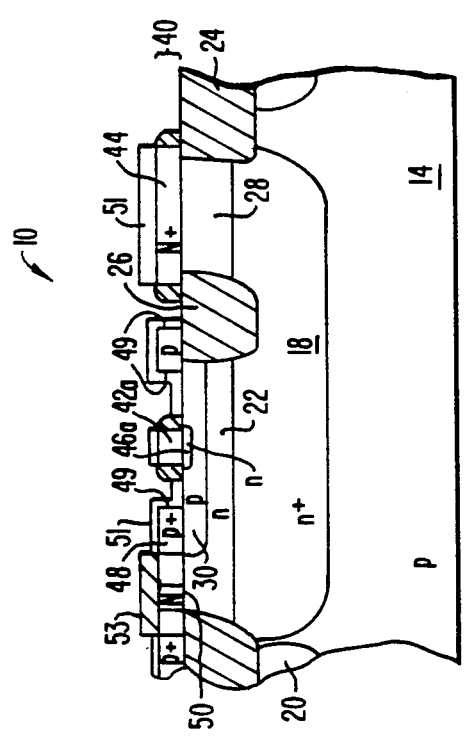
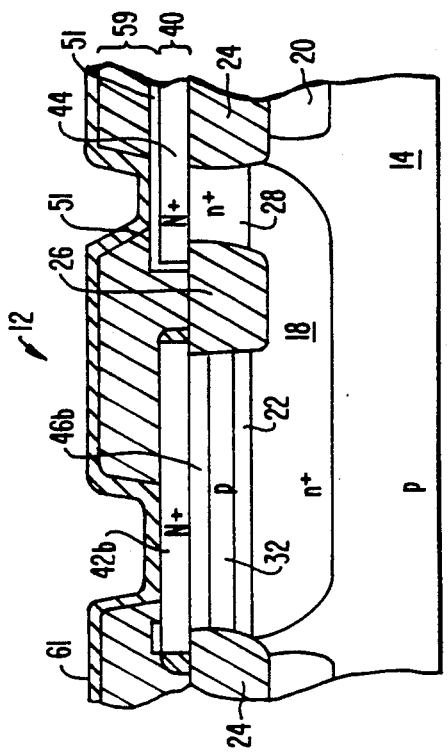
FIG. 2H.
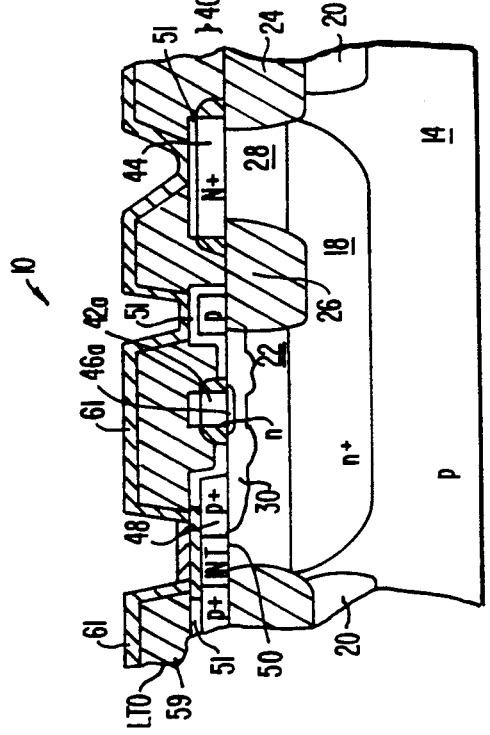

METHOD TO FABRICATE VERTICAL FUSE DEVICES AND SCHOTTKY DIODES USING THIN SACRIFICIAL LAYER

BACKGROUND OF THE INVENTION

This invention relates to a fabrication of Schottky transistors and vertical fuses in integrated circuits. In particular, the invention relates to a Schottky clamped transistor (SCT) having a first metal silicide on all contacts with a second metal silicide displacing the first silicide on at least a portion of the base contact. The invention also provides a vertical fuse having a polycrystalline silicon ("polysilicon") contact to an emitter that improves switching speed and reduces side wall junction capacitance between the emitter and a base.

Numerous processes are now well known for the fabrication of bipolar transistor integrated circuits. Oxide isolated bipolar transistors integrated circuits are also well known, for example, as taught by Douglas Peltzer in U.S. Pat. No. 3,648,125, entitled "Method of Fabricating Integrated Circuits with Oxidized Isolation and the Resulting Structure", hereby expressly incorporated by reference for all purposes.

In addition to the above described "isoplanar" processing technology, the manufacture of both bipolar transistor devices and CMOS devices on a single die and incorporated into a single integrated circuit have been taught in U.S. Pat. No. 4,764,480, issued Aug. 16, 1988 to Vora, entitled "Process for Making High Performance CMOS and Bipolar Integrated Devices On One Substrate With Reduced Cell Size", hereby expressly incorporated by reference for all purposes. The described process uses polysilicon as an interconnect medium to form contacts to desired active areas.

In typical oxide isolated processes of the prior art, an N-type buried layer is diffused into a P-type silicon substrate. An N-type epitaxial layer is then deposited across the upper surface of the substrate. A suitable mask, typically silicon nitride on silicon dioxide, then is formed on top of the epitaxial layer, with regions of the silicon nitride being removed wherever field oxide regions are desired in the epitaxial layer. The epitaxial layer then is oxidized through the openings in the nitride layer to define these field oxide regions. If a recessed field oxide region is desired, a silicon etch is performed prior to oxidation.

In conventional bipolar process technology, the epitaxial layer is then implanted with a P-type dopant to define a base of the bipolar device, and then a heavily doped N-type emitter is diffused within the base region. If a transistor is desired, metal contacts are formed to the emitter, base and collector. The base contact is spaced apart from the emitter contact, while the collector contact relies upon a collector sink of like conductivity type to the buell known, for example, as taught by Douglas Peltzer in U.S. Pat. No. 3,648,125, entitled "Method of Fabricating Integrated Circuits with Oxidized Isolation and the Resulting Structure", hereby expressly incorporated by reference for all purposes.

In addition to the above described "planar" processing technology, the manufacture of both bipolar transistor devices and CMOS devices on a single die and incorporated into a single integrated circuit have been taught in U.S. Pat. No. 4,764,480, issued Aug. 16, 1988 to Vora, entitled "Process for Making High Performance CMOS and Bipolar Integrated Devices On One Substrate With Reduced Cell Size", hereby expressly incorporated by reference for all purposes. The described process uses polysilicon as an interconnect medium to form contacts to desired active areas.

In typical oxide isolated processes of the prior art, an N-type buried layer is diffused into a P-type silicon substrate. An N-type epitaxial layer is then deposited across the upper surface of the substrate. A suitable mask, typically silicon nitride on silicon dioxide, then is formed on top of the epitaxial layer, with regions of the silicon nitride being removed wherever field oxide regions are desired in the epitaxial layer. The epitaxial layer then is oxidized through the openings in the nitride layer to define these field oxide regions. If a recessed field oxide region is desired, a silicon etch is performed prior to oxidation.

In conventional bipolar process technology, the epitaxial layer is then implanted with a P-type dopant to define a base of the bipolar device, and then a heavily doped N-type emitter is diffused within the base region. If a transistor is desired, metal contacts are formed to the emitter, base and collector. The base contact is spaced apart from the emitter contact, while the collector contact relies upon a collector sink of like conductivity type to the buried layer, extending from a surface of the epitaxial layer to the buried layer. If a fuse is to be formed, the base contact is omitted. If a Schottky clamped transistor is to be formed, metal is used to connect a collector contact with the base contact.

In the past, applications have employed bipolar transistor devices as fuses in a programmable read only memory ("PROM") and in a programmable array logic ("PAL") device, as well as in other types of circuits. Vertical fuses are generally preferred to lateral fuses in these applications due to a smaller size and a greater packing density within an integrated circuit. A fusing action in typical prior art vertical fuses is activated by supplying a sufficiently high current or voltage pulse between an emitter and a collector of a bipolar transistor such that the fuse device is transformed from a floating base NPN transistor "0" to a collector-base diode "1". In a memory of a preferred embodiment, the ohmic contact transforms a bit represented by a transistor from a "0" to a "1" storage element.

Some prior art processes form a polysilicon contact for emitter and collector regions. In conventional processes, the polysilicon is established as a relatively flexible means of contacting and interconnecting various active regions of an integrated circuit. Generally, polysilicon is formed over an entire die, and areas are selectively doped to form contacts to the silicon below, or to form resistive elements, as known in the art.

In providing metal contacts to the polysilicon regions, a refractory metal is deposited over the entire die and reacted wherein a silicide is formed. Typically, titanium ("Ti") is used whereby TiSi is formed. Other refractory metals may be used to produce a silicide, such as platinum silicide ("PtSi"), molybdenum silicide ("MoSi") and tantalum silicide ("TaSi"). Unreacted metal is removed and metallization processes are commenced. When incorporating vertical fuses on the same die as regular transistors, the metallization processes often include the formation of a barrier metal layer titanium-tungsten ("TiW") over the silicide on the transistors before a contact metal is deposited. The barrier metal prohibits the diffusion of contact metal atoms into the polysilicon for transistors, as happens with the contact metal in the vertical fuses. One problem in forming structures having transistors and fuses together is that of minimizing the process effects forming the barrier metal on the transistors without allowing the barrier metal to deposit on the fuses.

In addition to the use of vertical fuses, many integrated circuits benefit from the use of Schottky clamped transistors. These transistors are desirable for their controlled base current. The Schottky clamped transistor is a bipolar transistor using many of the same fabrication steps used to make a bipolar fuse device as above. However, the metal contact scheme necessary for the diode junction between the collector and base of the Schottky clamped transistor requires processing steps that are often incompatible with the fabrication of vertical fuses. For example, it is well known that PtSi is used as the Schottky metal contact in the Schottky clamped transistor, yet PtSi is undesirable in some fuse devices as it increases contact resistance. Furthermore, when Schottky devices and vertical fuses are fabricated on the same substrate, all the contact regions are opened before PtSi is deposited on the substrate surface. PtSi is only intended for the Schottky devices and an etch is used to remove any undesired PtSi from the remaining contacts, especially those on the vertical fuses. This etching is hard to precisely control, and because of such, the unintended overetching leads to shorting of the $VV_{EBO}$ of both the vertical fuses as well as top-contacted NPN transistors, when included. Furthermore, when fabricating Schottky clamped transistors and fuse devices on the same substrate, the Schottky clamped transistor must be protected from the interconnect metal, such as aluminum, to protect it from the same type of fusing action needed for the fuse device.

Therefore, an improved method for fabricating Schottky transistors and vertical fuse devices as well as improved devices resulting therefrom are desired.

SUMMARY OF THE INVENTION

According to the present invention, an improved method for fabricating polysilicon Schottky clamped transistors and vertical fuse devices preferably in the same semiconductor structure is disclosed. The resulting structure yields an improved Schottky clamped transistor and vertical fuse device. The improved Schottky transistor has a collector contact region and an emitter contact region of a first conductivity type, and a base contact region of a second conductivity type. The emitter and base contact regions have surfaces with a first refractory metal contact thereon. A collector window surface is adjacent to a portion of the base contact region and includes a second refractory metal contact on the window surface and the adjacent base contact region. A barrier metal overlies a portion of the first refractory metal on the base contact region and a portion of the second refractory metal on the base contact region and collector window surface to prevent the migration of an aluminum contact metal to the underlying emitter region under the emitter contact region.

The improved semiconductor structure also provides for an improved vertical fuse. The vertical fuse has a collector contact region and an emitter contact region of a first conductivity type, and a base region of a second conductivity type located below the emitter contact region. The emitter contact region includes a top surface portion that is free from at least one of, and in some embodiments, both the first and the second refractory metals. In one embodiment, the first refractory metal is titanium silicide, the second refractory metal is platinum silicide, and the barrier metal is titanium tungsten.

In fabricating a semiconductor structure having a Schottky transistor and a vertical fuse device, the semiconductor structure is defined to have a first area for the transistor and the second area for the fuse. After the formation of each device's collector regions, emitter regions, and base regions, a first refractory metal is reacted over selected areas of a polysilicon layer to form a first reacted refractory metal layer. The desired areas overlying the semiconductor structure are limited to the transistor and include at least a portion of the base region, of the emitter region, and of the collector region. Thereafter, a cap oxide is formed and contact vias formed therein. A thin sacrificial oxide layer is then grown over the substrate surface and the polysilicon is etched to extend to the underlying collector region to form a Schottky window. A window region is opened over a transistor collector window region next to a transistor base contact. A second metal silicide, preferably PtSi, is then formed in the Schottky contact window.

A first contact metal layer is formed over selected areas of the first and second refractory metal layers, except for over the fuse emitter contact. This first metal serves as a barrier layer. Finally, a second metal layer is provided over selected areas of the first and second refractory metal layer and over the fuse collector region at the surface area. This second metal serves as a contact metal for the various device regions.

It is important in the fuse device that no barrier metal separate the subsequent metal contact over the emitter contact region and, optionally, the collector contact region of the fuse device. Therefore, after the first refractory metal is layered, a sacrificial oxide layer is grown to mask the fuse device during the subsequent barrier metal step. The barrier metal prevents the aluminum used as the metal contact from migrating to the emitter contact region in the transistor, otherwise the aluminum would short out the transistor.

The resulting device may utilize thinner epitaxial layers to allow faster circuit operation and thinner field oxide to reduce stress on the silicon crystal and lowering junction leakage.

BRIEF DESCRIPTION OF THE DRAWINGS

FIGS. 2A through 2J are cross sections of a semiconductor die undergoing processing wherein the Schottky clamped transistor and vertical fuse are simultaneously fabricated alongside each other in the same die.

DESCRIPTION OF THE PREFERRED EMBODIMENT

I. General

Figure 1:
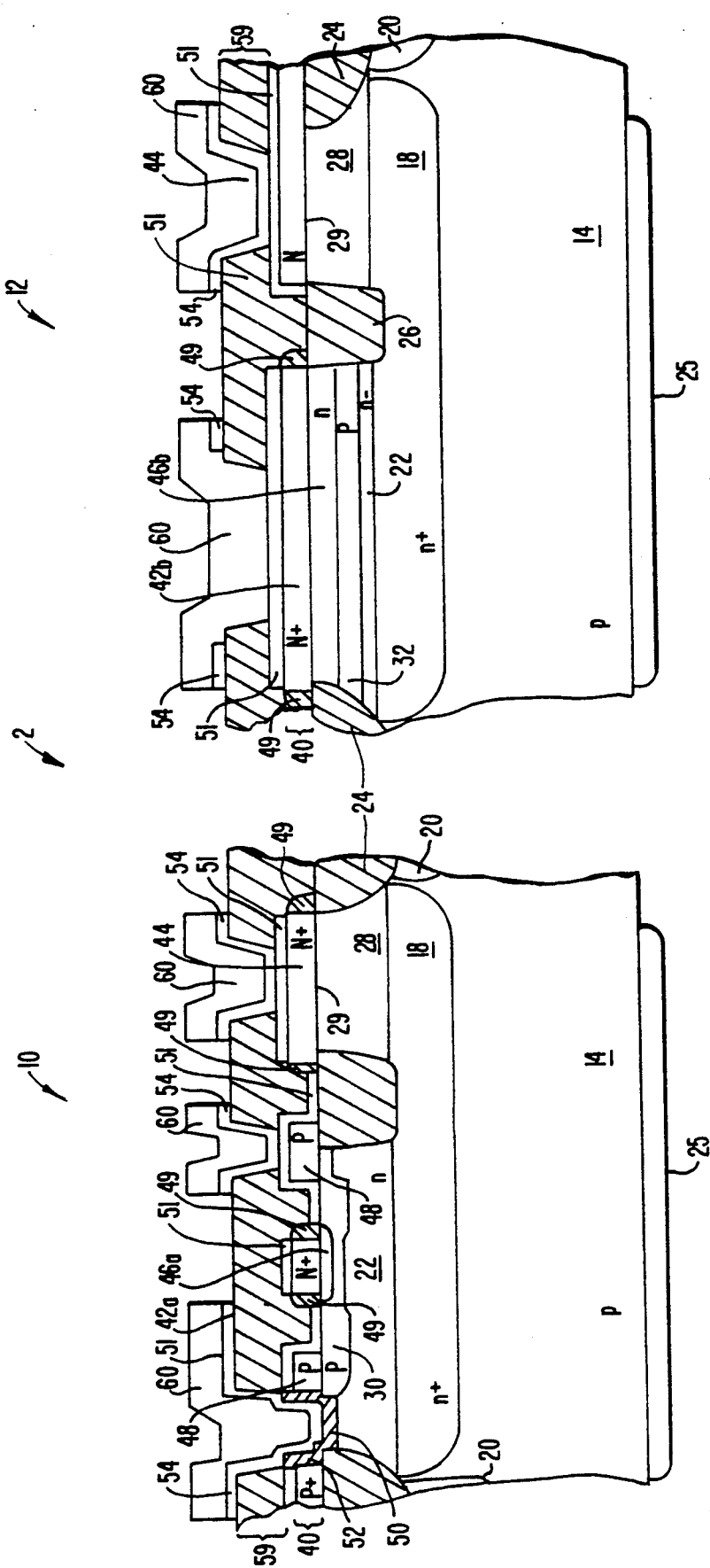
FIG. 1 is a cross-sectional view of a preferred embodiment of a Schottky clamped transistor and a vertical fuse according to one embodiment of the present invention.

FIG. 1 is a cross-sectional schematic illustration of a preferred embodiment for a Schottky clamp transistor 10 and a semiconductor fuse device 12. Transistor 10 and fuse device 12 includes a P conductivity type silicon substrate 14 doped with boron, in a preferred embodiment, to a predetermined resistivity. The resistivity value is about 30 to 50 ohms-centimeter ("Ω-cm"). A buried layer 18, which acts as a low resistivity path between the collector and a collector contact, extends into substrate 14 and is doped with arsenic to a peak concentration of approximately $10^{18}$ to $10^{19}/cm^3$. A thin N-type epitaxial layer 22 of monocrystalline silicon overlies the upper surface of the substrate 14 and buried layer 18. Epitaxial layer 22 has an approximate thickness of out 1 μm.

A channel stop implant 20 prevents channel inversion at the silicon-dioxide/silicon interface in field oxide regions. A fully recessed field oxide region 24 is used to provide isolation for transistor 10 and fuse device 12. Field oxide region 24 surrounds an island 25 of epitaxial silicon 22, to thereby provide an electrically-isolated pocket within which active and/or passive devices may be formed. A second field oxide 26 separates a collector sink 28 from a remainder of each device. Collector sink 28 is heavily doped with a peak active chemical dopant concentration with an N-type dopant of about $10^{19}$ to $10^{20}$ atoms/cm$^3$ of phosphorus, to provide ohmic continuity to buried layer 18 from a collector sink contact 44.

A transistor base 30 is provided having a peak active chemical dopant concentration of a P-type dopant of about $5 \times 10^{17}$ to about $5 \times 10^{18}$ atoms/cm$^3$, forming a base collector junction at a depth of about 0.25 μm below the polysilicon-monocrystalline interface. A base 32 is provided in the fuse having an average active chemical dopant concentration of the same P-type dopant at about $10^{17}$ to $10^{18}$ atoms/cm$^3$. Fuse base 32 has a thickness of about 0.2 μm.

An intrinsic polysilicon layer 40 is formed over epitaxial layer 22. Select regions are implanted to desired active chemical dopant concentrations. Fuse 12 has a polysilicon emitter contact 42b with N-type dopant atoms, typically arsenic, having an active chemical dopant concentration of about $10^{20}$ atoms/cm$^3$. Fuse emitter contact 42b is preferably formed to completely cover fuse base region 32 to prevent future extrinsic base implant operations from modifying the fuse device. Transistor 10 has an emitter contact 42a that is limited to cover only a portion of base region 30. Similarly, polysilicon collector sink contacts 44 are provided overlying collector sinks 28.

An emitter 46b in fuse 12, which is formed below polysilicon contact 42b and which overlies fuse base 32, and is formed by diffusion of N-type dopant atoms from emitter contact 42b. Emitter 46a in transistor 10 is formed below polysilicon contact 42a diffusion of N-type dopant atoms from emitter contact 42a.

A silicide layer 51, preferably formed by reacting a refractory metal, such as titanium to form titanium silicide ("TiSi$_2$"), is provided over selected areas of polysilicon layer 40. A collector window region 50, adjacent base contact 48, is masked so that no silicide layer 51 is formed thereon.

Collector window region 50 and a portion of transistor base contact 48 are opened so that a second refractory metal can be deposited thereon. A second silicide layer 52, preferably formed by reacting a refractory metal, such as platinum silicide ("PtSi"), is provided in collector window region 50 of transistor 10.

PtSi 52 is deposited and reacted so that one end contacts the TiSi$_2$ on the top surface of base contact 48. PtSi 52 extends down the sidewall of base contact 48 adjacent collector window region 50. PtSi layer 52 continues on collector window region 50 and up the sidewall of a base contact 48, further connecting TiSi layer 51 thereon. This second refractory metal location is preferred because it forms a Schottky diode that clamps the voltage between the collector and base of Schottky clamped transistor 10 to a desired voltage, or serve as a Schottky diode, depending upon the circuit characteristics needed.

A barrier metal interconnect region 54 is preferably formed from titanium tungsten ("TiW") having a composition of, for example, about 10% Ti, 90% W. The region 54 is provided over the TiSi$_2$ 51 and PtSi 52 areas except those over fuse emitter contact 42b. The barrier metal layer is provided to prevent aluminum diffusion, which is required for fuse action in vertical fuse 12, into the Schottky contacts.

A first contact metal layer 60 preferably comprising a mixture of aluminum (Al), silicon (Si), and copper (Cu) is formed on oxide layer 59. The metal layer 60 (metal-1) is preferably comprised of Al/Si/Cu in the following relative amounts, by weight, Al—about 93.5% to 100%, 95.1% preferred; Si—about 0.5% to 1.5%, 0.9% preferred; and Cu—0% to 5%, 4% preferred. The metal layer 60 contacts TiW 54 directly over the transistor emitter contact 42a (in which the contact is not shown), a base contact adjacent the collector contact 44 and the collector. The metal layer 60 contacts silicide layer 51 directly over the fuse emitter contact 42b. Contact metal layer 60 over emitter contact region 42b forms a connection for a bit line of fuse device 12 in one embodiment.

In some embodiments, a second contact metal layer (not shown) of Al/Si/Cu is coupled to polysilicon region 44 to provide a contact for a word line of fuse device 12. Oxide (not shown) will provide isolation and protection for the structures of transistor 10 and fuse device 12. Fuse base 32 does not have an external connection and "floats" with respect to bit and word lines for the preferred embodiment.

II. Process Flow

FIGS. 2A-2J are cross sections of a semiconductor die undergoing a type of processing wherein a vertical fuse device embodying the present invention is simultaneously fabricated along side a Schottky clamped transistor (SCT) with both devices formed on the same die to form a Schottky clamped transistor and a vertical fuse as illustrated in FIG. 1.

Figures 2A, 2B:
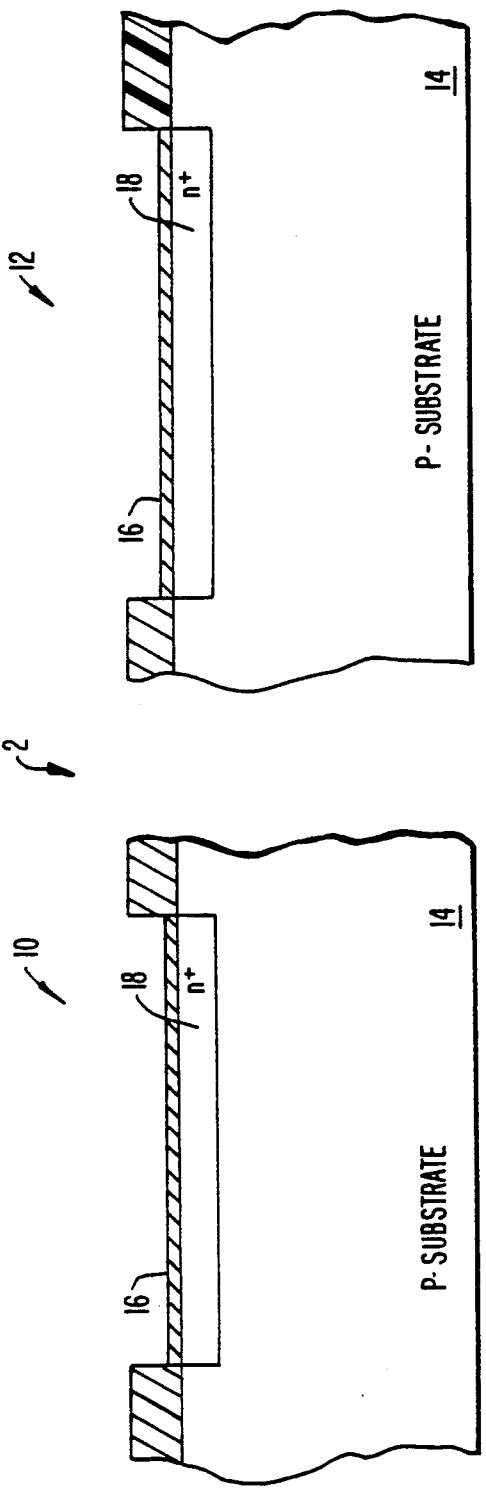

FIG. 2A is a cross section of a die 2 divided into two areas. A first area has been preselected for formation of a SCT 10 while a second area has been preselected for formation of a vertical fuse device 12. A P substrate 14 has been oxidized by techniques well known to those in the art. P substrate 12 is selectively masked, etched, and oxidized again to provide an implant protection oxide 16 and to define the buried layers of the transistor and fuse. N-type dopants are then implanted to form buried layer 18. Arsenic atoms are used to form buried layer 18. Similar implants (not shown) using a P dopant form channel stop regions 20.

The field implant is then annealed and a phosphorus doped reduced pressure ("RP") epitaxial silicon layer is grown and oxidized as shown in FIG. 2B. The epitaxial layer 22 has an active chemical dopant concentration of about $10^{15}$ to about $10^{16}$ atoms/cm$^3$.

FIG. 2C is a cross section of die 2 wherein isolation islands have been formed and a bird-head planarization process has been performed. These isolation islands are formed by an oxide/nitride sandwich deposition, mask and KOH etch followed by high pressure oxidation (HI POX) procedures. A rectilinear region is formed by oxide 24 and divided into two areas by oxide 26.

FIG. 2D is a cross section of die 2 after having a sink mask (not shown) applied and a sink implant step performed. The sink implant is annealed to provide sink regions 28 and is followed by an intrinsic unmasked base implant of SCT 10 while fuse device 12 is masked a mask M. A base implant using $BF^{+2}$ provides with SCT 10 with a base 30 having an active chemical dopant concentration of about $10^{17}$ to about $10^{18}$ atoms/cm$^3$, with about $1 \times 10^{18}$ atoms/cm$^3$ preferred. Typically, the base implant is performed by using an implant energy of between about 40 and 50 KeV, and a dose of between $2 \times 10^{13}$ and $3 \times 10^{13}$ ions/cm$^3$ with implant energies of about 45 KeV and doses of about $3 \times 10^{13}$ ions/cm$^3$ preferred. Base implant provides a $\beta$ for the to-be-formed transistor in the range of, for example, approximately 80 to about 120. Mask M protects the fuse device.

Figure 2E:
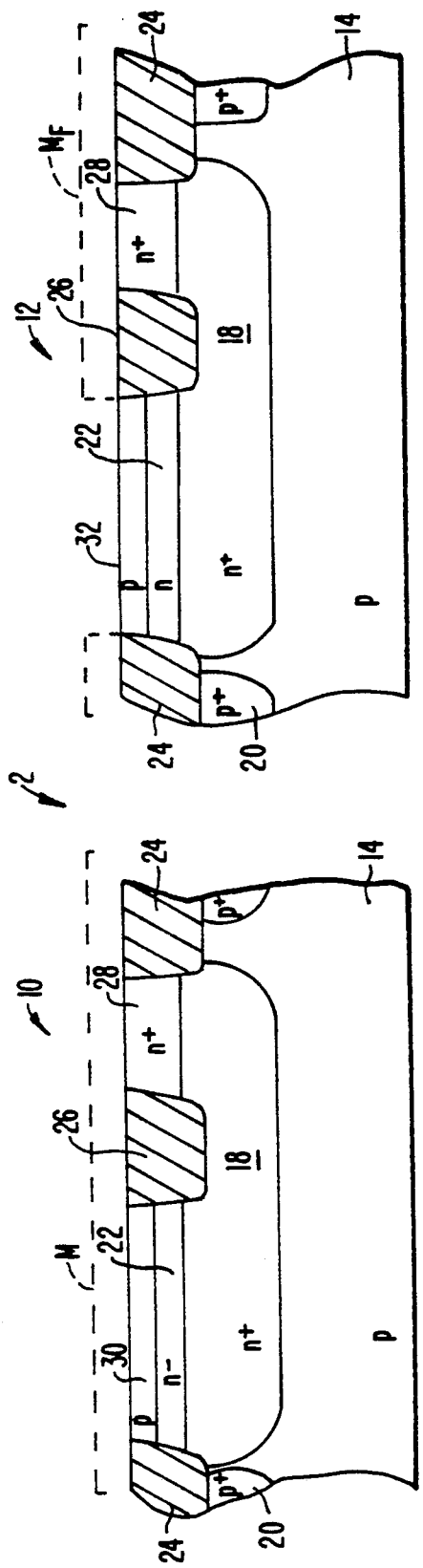

FIG. 2E is a cross section of die 2 having a mask overlying the sink of the fuse device and SCT 10. A separate base implant is optionally performed to provide base 32 with different parameters and characteristics than base 30 of SCT 10, if desired. The separate fuse base implant step is typically performed with $BF^{+2}$ ions using an implant energy of about 50 to 100 KeV and a dose of $1 \times 10^{13}$ to $5 \times 10^{13}$ ions/cm$^3$, with an implant energy and a dose of about 70 KeV and $2 \times 10^{13}$ ions/cm$^3$ preferred.

Figure 2F:
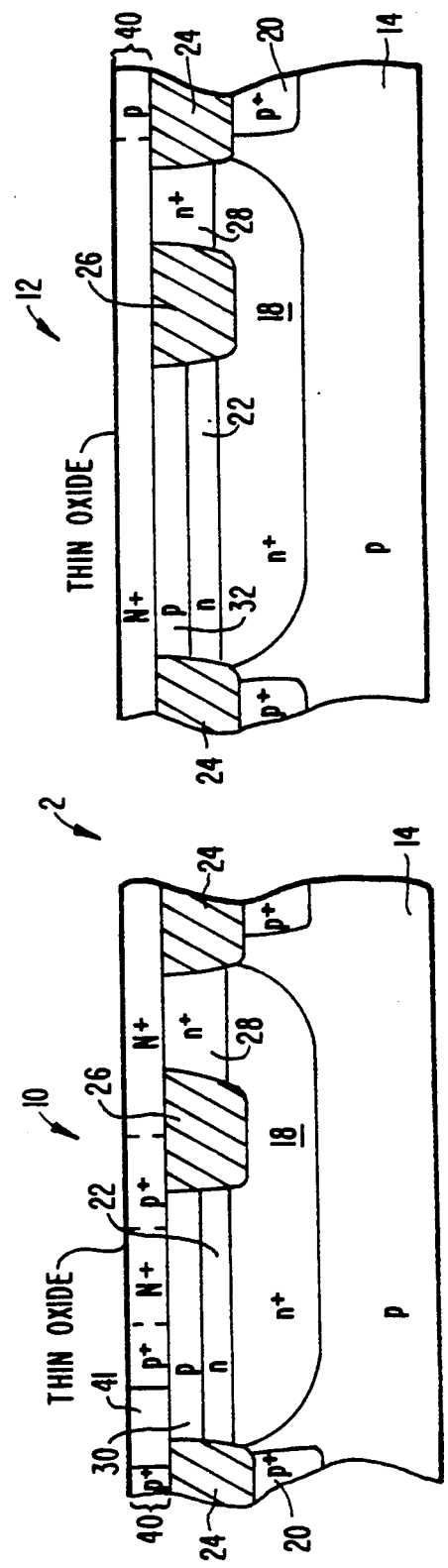

FIG. 2F is a cross section of die 2 having a layer 40 of polycrystalline silicon ("polysilicon") deposited over an entire surface of die 2. The polysilicon has a thickness in a range of about 4,000 to 5,000 Å, preferably 4,500 Å. Polysilicon layer 40 has a thin cap oxidation through which both P- and N-type impurities are implanted into polysilicon layer 40. Oversize masks are used to permit P+, P-, and N+ areas in polysilicon layer 40 to be formed where various elements, such as an emitter, base, and collector contact, and resistive elements (not shown) as desired, are to be formed for Schottky clamp transistor 10 and fuse device 12. Region 41 is not exposed in either the P+ or N+ implants and, accordingly, remains intrinsic.

Polysilicon layer 40 is formed to preferably have columnar grain boundaries having an average diameter of about 200 Å. It will be appreciated that polysilicon grain boundary size is a function of temperature and doping concentration. It is by these grain boundaries that mask transport of metal conductive metal atoms occurs. The importance of these grain boundaries is beyond the scope of the present invention and is discussed more fully in a separate patent application Ser. No. 07/570,131 filed 8/20/90, "Polysilicon Vertical Fuse Device", filed the same day as the present invention and assigned to the same assignee, herein incorporated for all purposes.

FIG. 2G is a cross section of die 2 after polysilicon layer 40 has been defined and etched. N+ polysilicon emitter contacts 42a, and 42b and N+ polysilicon collector sink contacts 44 are formed which will provide a contact to emitters 46a and 46b, and to collector sinks 28, respectively. Polysilicon emitter contact 42b is provided with a lateral dimension sufficient to completely overlap fuse base region 32. Schottky clamp transistor 10 is provided with a P+ base contact 48. Oxide sidewalls are then formed on selected portions of the contacts as shown in FIG. 2G and disclosed in copending application Ser. No. 503,498, which is incorporated herein by reference for all purposes.

Thereafter, an extrinsic base implant is performed. The extrinsic base implant forms more heavily doped regions in the base between the emitter and base contacts in the transistor. Polysilicon fuse emitter contact 42b prevents modification of fuse base 32 parameters during the extrinsic base implant operation, which is followed by a cap oxidation.

Die 2 then has a silicide exclusion mask 53 applied to protect collector window region 50 and, optionally, fuse emitter 42b (as well as selected resistors, which are not shown), followed by a final anneal/oxidation step. This step drives some of the dopants from this polysilicon contact areas into the underlying epitaxial layer 22. This has the effect of creating an emitter 46b in fuse device 12 and an emitter 46a in SCT 10. After the anneal step, a silicide exclusion mask is optionally formed, followed by deposition of a refractory metal, preferably titanium ("Ti"), over die 2. Other possible refractory metals are platinum, molybdenum and tantalum. The titanium deposition is followed by a first silicide reaction wherein $TiSi_2$ 51 is formed where titanium contacts polysilicon layer 40. Excess titanium is stripped, followed by a second silicide reaction producing $TiSi_2$ 51 overlying the polysilicon contact areas except for the oxide sidewall of polysilicon contacts, and on the regions where the silicide exclusion oxide remains. In some embodiments, the first silicide is excluded from the fuse emitter, as shown in FIGS. 2G et seq., while first silicide is included on the emitter, as in FIG. 1. Silicide is also excluded in preferred embodiments over the SCT contact window.

$TiSi_2$ 51 covers the top surface of transistor base contact 48 and extends down one sidewall 49 adjacent to emitter contact 42a and ending at the base of the sidewall of emitter contact 42a. $TiSi_2$ 51 also covers the top surface of emitter contact 42a. The $TiSi_2$ then extends from the base of the other sidewall of the emitter contact 42a to a second part of the base contact 48, covering both sidewalls 49 and the top surface of the base contact, and ending on oxide isolation 26. Transistor and fuse collector contacts 44 also include $TiSi_2$ 51 on their top surface.

FIG. 2H is a cross section of die 2 after a chemical vapor deposition ("CVD") oxide 59, planarization then etch back/CVD contact mask/etch have been performed. A thin sacrificial oxide layer made from a low temperature oxide 61 (LTO) is then grown over the surface of die 2, preferably, having a thickness of between 600 to 1000 Å.

Figure 2I:
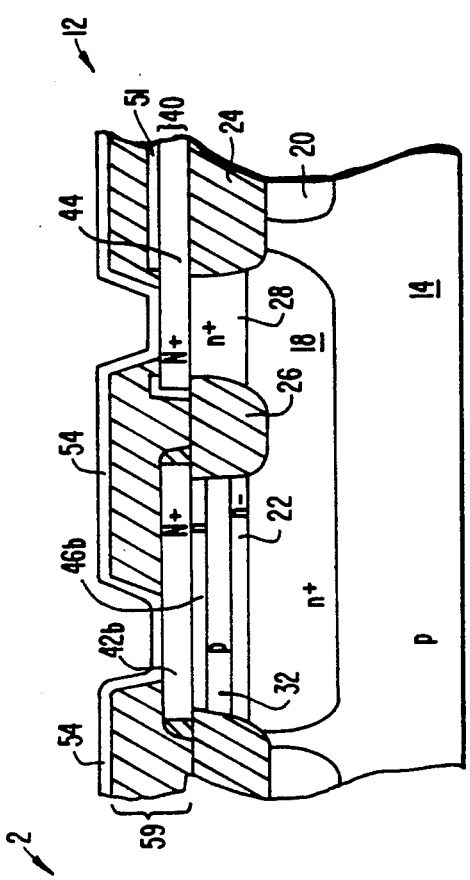
Figure 2I:
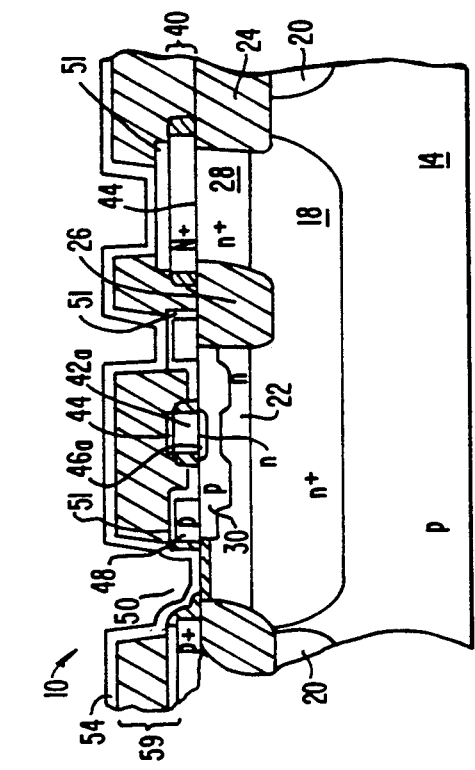

Thereafter, as shown in FIG. 2I, a Schottky mask and etch are performed in which the oxide and polysilicon are etched to open the Schottky window 50. Thereafter, a second refractory metal, preferably platinum ("Pt"), is deposited over die 2. The platinum deposition is followed by a first silicide reaction wherein PtSi is formed where platinum contacts polysilicon layer 40 and epilayer 30; in this case, the Schottky window 50, which includes the sidewall of the base polysilicon contact and the upper surface of the collector contact. Excess platinum is stripped, followed by a second silicide reaction (i.e., a second heating step). Only Schottky clamp transistor 10 has a platinum silicide contact in collector window region 50. PtSi layer 52 covers the horizontal surface of collector window region 50 and extends up both adjacent sidewalls until contacting the $TiSi_2$ 51 on each sidewall. PtSi layer 52 is added on collector window region 50 to form a rectifying contact between the base and the collector of transistor 10. PtSi layer 52 contacts TiSi$_2$ 51 for improved clamping action.

Thereafter, an etching of LTO 61 is performed to re-open the contact windows A barrier metal 54 is deposited over the entire surface of die 2. Barrier metal 54 typically comprises titanium tungsten ("TiW"). Selected areas are masked to permit barrier metal contacts to remain after a removal process. In this case, barrier metal is removed from the surface of the exposed vertical fuse emitter contact 42b. On transistor 10, barrier metal contact 54 forms a contact on collector window region 50 and base contact 48, contacting PtSi 52, oxide 59, and TiSi$_2$ 51. A barrier metal contact 54 forms a contact on collector contact 44, contacting oxide 59 and TiSi$_2$ 51.

The barrier metal is removed from the fuse emitter as it would block the migration of aluminum, provided during a subsequent contact step, and needed in order to short fuse device 12. Excess TiW is removed by a standard dry-etch process. Polysilicon emitter contact 42b and, optionally, the collector contact 44 of fuse 12 20 are left without TiW. In an accompanying application, filed the same day as the present invention, U.S. Ser. No. 07/571,346 filed 8/22/90 "Polysilicon Schottky Clamped Transistor and Vertical Fuse Devices", incorporated herein by reference for all purposes, discloses a method to protect the fuse emitter where no metal is desired.

Figure 2J:
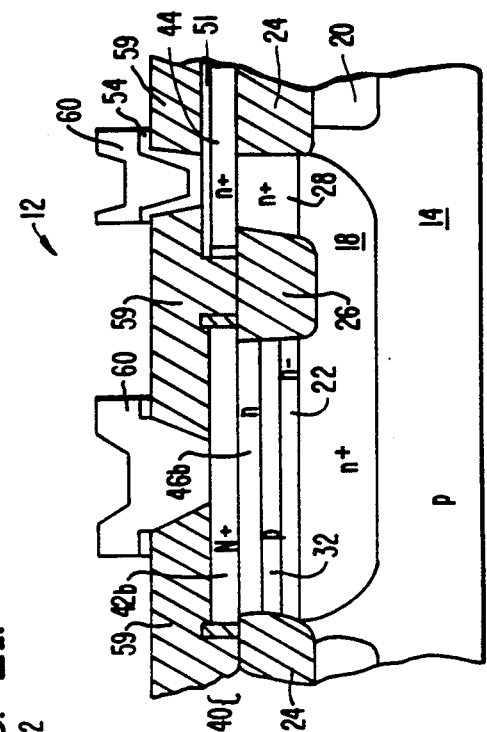
Figure 2J:
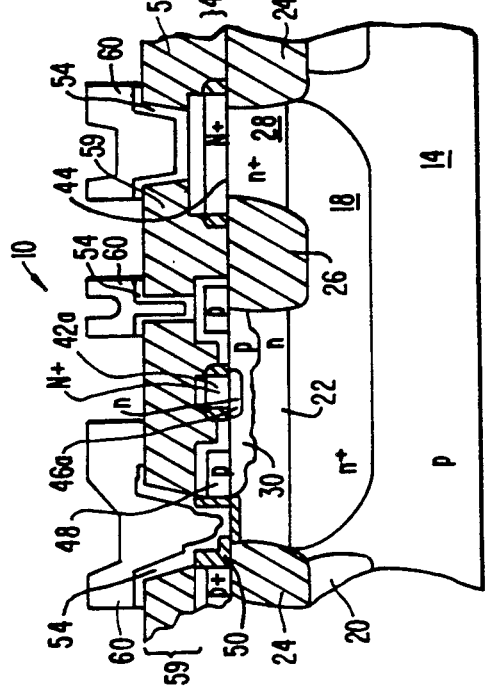

FIG. 2J is a cross section of die 2 having a contact metal 60 deposited, masked and etched to form metal contacts. The deposited contact metal 60 is a mixture of aluminum, silicon, and copper. Contact metal 60 is deposited directly on the polysilicon emitter contact 42b over emitter 46b. A small portion of barrier metal contact 54 may remain between the peripheral edge of contact metal 60 and oxide 59. Contact metal 60 directly contacts the polysilicon in fuse emitter contact 42b (or first silicide, if it remains). For connections to other active areas, barrier metal 54 (TiW) isolates the contact metal from polysilicon layer 40. Finally, a dielectric CVD oxide (not shown) is formed and subsequently masked and etched to form additional metal contact layers (not shown) to the formed SCT 10 and fuse device 12 on die 2.

Overall, the device characteristics for the Schottky clamped transistor having a minimum emitter area of 0.8×1.6 square microns are: current gain=90, BV$_{ceo}$=7 volts, BV$_{eco}$=2.5 volts and F$_t$=14 GHz. The device characteristics for the vertical fuse having an area of 1.6×1.6 microns square are: BV$_{ceo}$>8 volts, BV$_{eco}$>3 volts and programming power approximately 200 mWatts, with post programmed fuses exhibiting series resistance of less than 150 ohms and one nanoamp of leakage current.

The invention has now been described with reference to specific embodiments. Other embodiments will be apparent to those of ordinary skill in the art. It is therefore not intended that this invention be limited, except as indicated in the appended claims.

What is claimed is:

1. A process for fabricating a semiconductor structure on a substrate having a Sckottky transistor, said transistor further including a collector region, an emitter region, and a base region, said base region being between said collector and emitter regions, the process comprising the steps of:

a) reacting a first refractory metal over selected areas of a contact polysilicon layer to form a first reacted refractory metal layer, said selected areas further comprising at least a portion of a contact to said transistor base region, a contact to said transistor emitter region, and a contact to said transistor collector region;
   b) forming a contact oxide layer and etching contact vias therein;
   c) growing a thin sacrificial oxide layer over said first and second areas;
   d) forming a contact window through said contact polysilicon to said transistor collector region; and
   e) depositing and reacting a second refractory metal to form a second refractory metal silicide contact on said collector window and said base polysilicon contact, said second silicide forming an ohmic contact between said base and said collector.

2. The process of claim 1, after the step of replacing with said second refractory metal, further including the step of removing unreacted second refractory metal and remaining portions of said thin sacrificial oxide layer from said first and second areas.

3. The process of claim 1 wherein said first reacted refractory metal layer comprises titanium silicide.

4. The process of claim 1 wherein said second reacted refractory metal layer comprises platinum silicide.

5. The process of claim 1 wherein said first metal comprises titanium and said second metal comprises platinum.

6. The process of claim 1 further comprising the step of forming a barrier metal on at least said second refractory metal and contact metal on said barrier metal.

7. The process of claim 6 wherein said barrier metal comprises TiW and said contact metal comprises aluminum.

8. A process for fabricating a semiconductor structure having a Schottky transistor in a first area and a vertical fuse device in a second area, the process comprising the steps of:

a) on a semiconductor substrate, implanting a first type of dopants into said substrate to form a collector region for said Schottky transistor and said vertical fuse device;
   b) growing an epitaxial layer over said substrate and said collector regions;
   c) implanting a second type of dopants into a base region of said epitaxial layer for said Schottky transistor, said transistor base region isolated from a sink region coupling a part of a surface of said epitaxial layer to said transistor collector region;
   d) implanting said second type of dopants into a base region of said epitaxial layer for said vertical fuse device, said fuse base region isolated from a sink region coupling a part of a surface of said epitaxial layer to said fuse collector region;
   e) depositing a polycrystalline layer having a plurality of grain boundaries over said surface of said epitaxial layer;
   f) implanting said first type dopants in at least a portion of said polycrystalline layer overlying said base regions and second type dopants in at least base contact regions of said polycrystalline layer;
   g) treating said semiconductor structure to promote migration of said first dopant types across an interface of said polycrystalline layer into said epitaxial layer to an emitter region overlying said transistor and fuse base regions;

h) reacting a first refractory metal over selected areas of said polycrystalline layer to form a first refractory metal layer, said selected areas overlying said transistor base region and a portion of said transistor emitter region;

i) growing a thick oxide layer and etching contact vias therein;

j) growing a thin sacrificial oxide layer over said first and second areas;

k) etching a contact window through said polysilicon layer to said transistor collector region;

l) depositing and heating a second refractory metal to form a second metal silicide in said contact window, said second silicide forming a rectifying contact between said transistor base region and said transistor collector region;

m) forming a barrier metal layer on said first and second areas;

n) removing a portion of said barrier metal from said fuse emitter region; and o) forming a contact metal, said contact metal directly contacting said first silicide on said fuse emitter.

9. The process of claim 8 wherein said polycrystalline layer comprises silicon, said reacted refractory metal layer comprises titanium silicide, and said second reacted refractory metal layer comprises platinum silicide.

10. The process of claim 8 wherein said barrier metal comprises titanium-tungsten.

11. The process of claim 8 wherein said step of implanting first and second dopants into said polycrystalline layer does not dope said polycrystalline in said contact window.

* * * * *